United States Patent
Park

(10) Patent No.: US 7,505,737 B2
(45) Date of Patent: Mar. 17, 2009

(54) APPARATUS FOR GENERATING CLOCK SIGNAL IN MOBILE COMMUNICATION TERMINAL

(75) Inventor: Book Sung Park, Seoul (KR)

(73) Assignee: Pantech & Curitel Communications, Inc, Seoul (KR)

( * ) Notice: Subject to any disclaimer, the term of this patent is extended or adjusted under 35 U.S.C. 154(b) by 408 days.

(21) Appl. No.: 11/326,534

(22) Filed: Jan. 5, 2006

(65) Prior Publication Data

US 2006/0146890 A1    Jul. 6, 2006

(30) Foreign Application Priority Data

Jan. 5, 2005    (KR) .............. 10-2005-0000913

(51) Int. Cl.
    *H04B 1/00*    (2006.01)
(52) U.S. Cl. ............... 455/63.1; 455/67.13; 455/570; 455/114.2; 375/226; 375/240
(58) Field of Classification Search ............... 455/63.1, 455/67.13, 570, 114.2, 501, 222, 278.1, 296; 375/226, 240, 371, 376; 702/69
    See application file for complete search history.

(56) References Cited

U.S. PATENT DOCUMENTS

| | | | | | |
|---|---|---|---|---|---|
| 4,542,514 | A | * | 9/1985 | Watanabe | 375/226 |
| 5,214,676 | A | * | 5/1993 | Wilkinson | 375/371 |
| 5,898,665 | A | * | 4/1999 | Sawahashi et al. | 370/342 |
| 6,101,230 | A | * | 8/2000 | Chun et al. | 375/355 |
| 6,163,208 | A | * | 12/2000 | Christensen et al. | 329/304 |
| 6,204,732 | B1 | * | 3/2001 | Rapoport et al. | 331/2 |
| 6,246,717 | B1 | * | 6/2001 | Chen et al. | 375/226 |
| 6,275,523 | B1 | * | 8/2001 | Chen et al. | 375/226 |
| 6,559,698 | B1 | * | 5/2003 | Miyabe | 327/157 |
| 6,687,629 | B1 | * | 2/2004 | Yamaguchi et al. | 702/69 |
| 6,768,385 | B2 | * | 7/2004 | Smith | 331/1 A |
| 6,795,496 | B1 | * | 9/2004 | Soma et al. | 375/226 |
| 7,205,798 | B1 | * | 4/2007 | Agarwal et al. | 327/105 |
| 7,274,231 | B1 | * | 9/2007 | Gillespie et al. | 327/158 |
| 2002/0167360 | A1 | * | 11/2002 | Smith | 331/1 A |
| 2002/0167365 | A1 | * | 11/2002 | Smith | 331/100 |
| 2008/0106832 | A1 | * | 5/2008 | Restrepo et al. | 361/42 |

FOREIGN PATENT DOCUMENTS

| KR | 19990060654 | 7/1999 |
|---|---|---|
| KR | 1020000028624 | 5/2000 |

\* cited by examiner

*Primary Examiner*—Minh D Dao
(74) *Attorney, Agent, or Firm*—H.C. Park & Associates, PLC

(57) ABSTRACT

Disclosed is an apparatus for generating a stable clock signal having a Long term jitter noise removed therefrom. In a mobile communication terminal having a power management chip for converting a sinusoidal wave oscillated in a crystal into a clock signal of square wave, the sinusoidal wave is converted into a square wave clock signal by the stabilized driving power having no alternating current components, and thus a power noise of the square wave clock signal is removed. Then, the square wave clock signal having the power noise removed therefrom is outputted after a predetermined delay time. Accordingly, it is possible to supply the clock signal having the Long term jitter noise removed therefrom and synchronized to each device in the mobile communication terminal.

20 Claims, 3 Drawing Sheets

(a)

(b)

(c)

(a)

(b)

APPARATUS FOR GENERATING CLOCK SIGNAL IN MOBILE COMMUNICATION TERMINAL

CROSS-REFERENCE TO RELATED APPLICATION

The present application is claiming priority of Korean Patent Application No. 10-2005-0000913, filed on Jan. 5, 2005, the content of which is herein incorporated by reference.

BACKGROUND OF THE INVENTION

1. Field of the Invention

The present invention relates to an apparatus for generating and supplying clock signal having a Long term jitter noise removed therefrom to each device in a mobile communication terminal containing the apparatus and having a power management chip mounted thereto for converting a sinusoidal wave oscillated in a crystal to generate a clock signal of square wave.

2. Description of the Prior Art

A jitter noise occurring in a wireless circuit is meant by a kind of distortion phenomenon that an output signal vibrates for a time axis. Due to the jitter noise, an output signal in a time area is outputted after a predetermined delay time. In addition, a waveform of the output signal in a frequency area is dispersed to the neighborhood of a specific frequency, instead of being formed sharply in the specific frequency. The jitter noises can be classified into a Cycle to cycle jitter noise as shown in FIG. 1(a), a Period jitter noise as shown in FIG. 1(b) and a Long term jitter noise as shown in FIG. 1(c) according to shapes of an output signal distorted due to the jitter noise.

In the mean time, in mobile communication terminals of GSM (Global System for Mobile communication)/CDMA (Code Division Multiple Access)/WCDMA (Wideband Code Division Multiple Access) types, most of power management chips use a crystal as an oscillator. At this time, the jitter noises as shown in FIGS. 1(a) to 1(c) can occur in a clock signal outputted from the power management chip. In particular, the 'long term jitter noise' as shown in FIG. 1(c) which is mainly induced in a power supply of the oscillator using the crystal causes a time difference in the waveform of the clock signal. Owing to the time difference, the clock signal supplied to each device, such as baseband processor, memory and the like in the mobile communication terminal is not synchronized, so that there may occur a driving error in each device.

SUMMARY OF THE INVENTION

Accordingly, the present invention has been made to solve the above problems. An object of the invention is to provide an apparatus capable of supplying a clock signal having a Long term jitter noise removed therefrom to each device in a mobile communication terminal containing the apparatus and having a power management chip mounted thereto for converting a sinusoidal wave oscillated in a crystal to generate a clock signal of square wave.

In order to achieve the above object, there is provided an apparatus for generating a clock signal in a mobile communication terminal, the apparatus comprising a clock signal generating section for outputting a sinusoidal wave clock signal having an extremely low oscillating frequency; a surge current preventing section for removing a surge current of the sinusoidal wave clock signal; a square wave converting section for converting the sinusoidal wave clock signal having the surge current removed therefrom into a square wave clock signal using a driving power having no alternating current components; a power noise removing section for removing a power noise included in the square wave clock signal outputted from the square wave converting section; and a clock signal error correcting section for receiving the square wave clock signal outputted from the power noise removing section and outputting the received square wave clock signal after a predetermined delay time.

According to another embodiment of the invention, there is provided an apparatus for generating a clock signal in a mobile communication terminal, the apparatus comprising an oscillating section for outputting a sinusoidal wave having a medium oscillating frequency; a divider for dividing an output of the oscillating section in a predetermined dividing ratio to output a sinusoidal wave clock signal; a surge current preventing section for removing a surge current of the sinusoidal wave clock signal; a square wave converting section for converting the sinusoidal wave clock signal having the surge current removed therefrom into a square wave clock signal using a driving power having no alternating current components; a power noise removing section for removing a power noise included in the square wave clock signal outputted from the square wave converting section; and a clock signal error correcting section for receiving the square wave clock signal outputted from the power noise removing section and outputting the received square wave clock signal after a predetermined delay time.

According to another embodiment of the invention, there is provided an apparatus for generating a clock signal in a mobile communication terminal, the apparatus comprising a clock signal generating section for outputting a sinusoidal wave clock signal having an extremely low oscillating frequency; an oscillating section for outputting a sinusoidal wave having a medium oscillating frequency; a divider for dividing an output of the oscillating section in a predetermined dividing ratio to output a second sinusoidal wave clock signal; a surge current preventing section for removing surge currents of the first and second clock signals; a square wave converting section for converting the first and second sinusoidal wave clock signals having the surge currents removed therefrom into a square wave clock signal using a driving power having no alternating current components; a power noise removing section for removing a power noise included in the square wave clock signal outputted from the square wave converting section; and a clock signal error correcting section for receiving the square wave clock signals outputted from the power noise removing section and outputting the received square wave clock signals after a predetermined delay time.

BRIEF DESCRIPTION OF THE DRAWINGS

The above and other objects, features and advantages of the present invention will be more apparent from the following detailed description taken in conjunction with the accompanying drawings, in which:

FIG. 3(*b*) is a waveform diagram of a clock signal outputted from a clock signal error correcting section in the apparatus for generating a clock signal shown in FIG. 2.

DETAILED DESCRIPTION OF THE PREFERRED EMBODIMENTS

Figure 1:
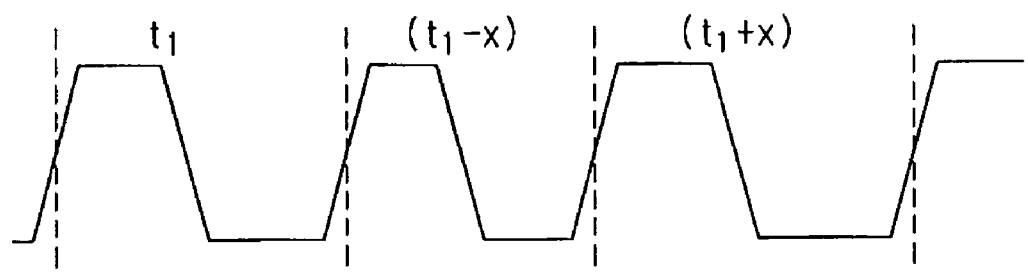
FIG. 1(a) is a waveform diagram of a Cycle to cycle jitter noise which may be occurred in a wireless circuit.
FIG. 1(b) is a waveform diagram of a Period jitter noise which may be occurred in a wireless circuit.
FIG. 1(c) is a waveform diagram of a Long term jitter noise which may be occurred in a wireless circuit.
Figure 1:
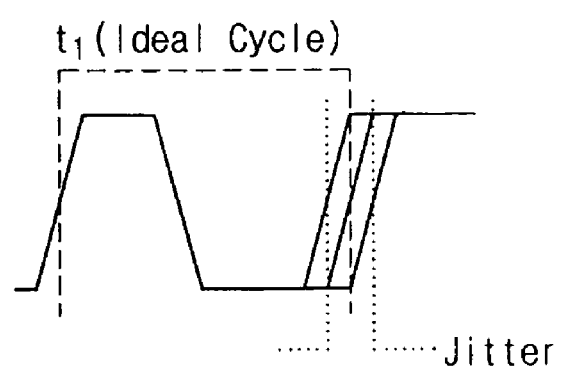
Figure 1:
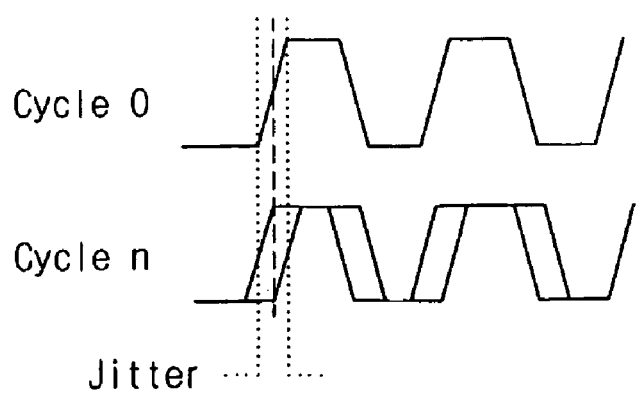

Hereinafter, a preferred embodiment of the present invention will be described with reference to the accompanying drawings. In the following description of the present invention, a detailed description of known functions and configurations incorporated herein will be omitted when it may make the subject matter of the present invention rather unclear.

An apparatus for generating a clock signal in a mobile communication terminal according to an embodiment of the invention comprises a clock signal generating section 10, an oscillating section 20, a divider 30, a surge current preventing section 40, a square wave converting section 50, a power noise removing section 60 and a clock signal error correcting section 70.

The clock signal generating section 10 outputs a first sinusoidal wave clock signal. The clock signal generating section 10 may comprise a crystal oscillating part 11, an amplifying part 12 and an automatic gain control (AGC) 13.

The crystal oscillating part 11 outputs a sinusoidal wave using a crystal oscillator 111, which is a low input signal having an low amplitude intensity and an extremely low oscillating frequency (for example, about 32.768 kHz that is a frequency of a reference clock signal used in typical mobile communication terminals).

The amplifying part 12 may comprise a capacitor C3 for removing an alternating current component and a transistor Q1 for sensing and amplifying the low input signal. The amplifying part 12 amplifies the sinusoidal wave of low input signal outputted from the crystal oscillating part 11 to a predetermined level and then outputs the amplified wave. At this time, it is possible to control a gain of the signal outputted from the amplifying part 12 through the AGC 13.

In order to set up the crystal oscillator 111, values of capacitors C1, C2 are determined according to a following equation calculating a total load capacitor applied to the crystal oscillator 111.

$$C_L = \frac{C1 * C2}{C1 + C2} + C_S [\text{pF}] \quad [\text{equation}]$$

, where $C_L$: total load capacitance and $C_S$: capacitance of the crystal oscillator 111 itself.

The divider 30 divides a sinusoidal wave having an oscillating frequency of medium frequency (MF) (for example, about 3.2 MHz) outputted from the oscillating section 20 in a predetermined dividing ratio (for example, 32,768 times) to output a second sinusoidal wave clock signal.

Figure 2:
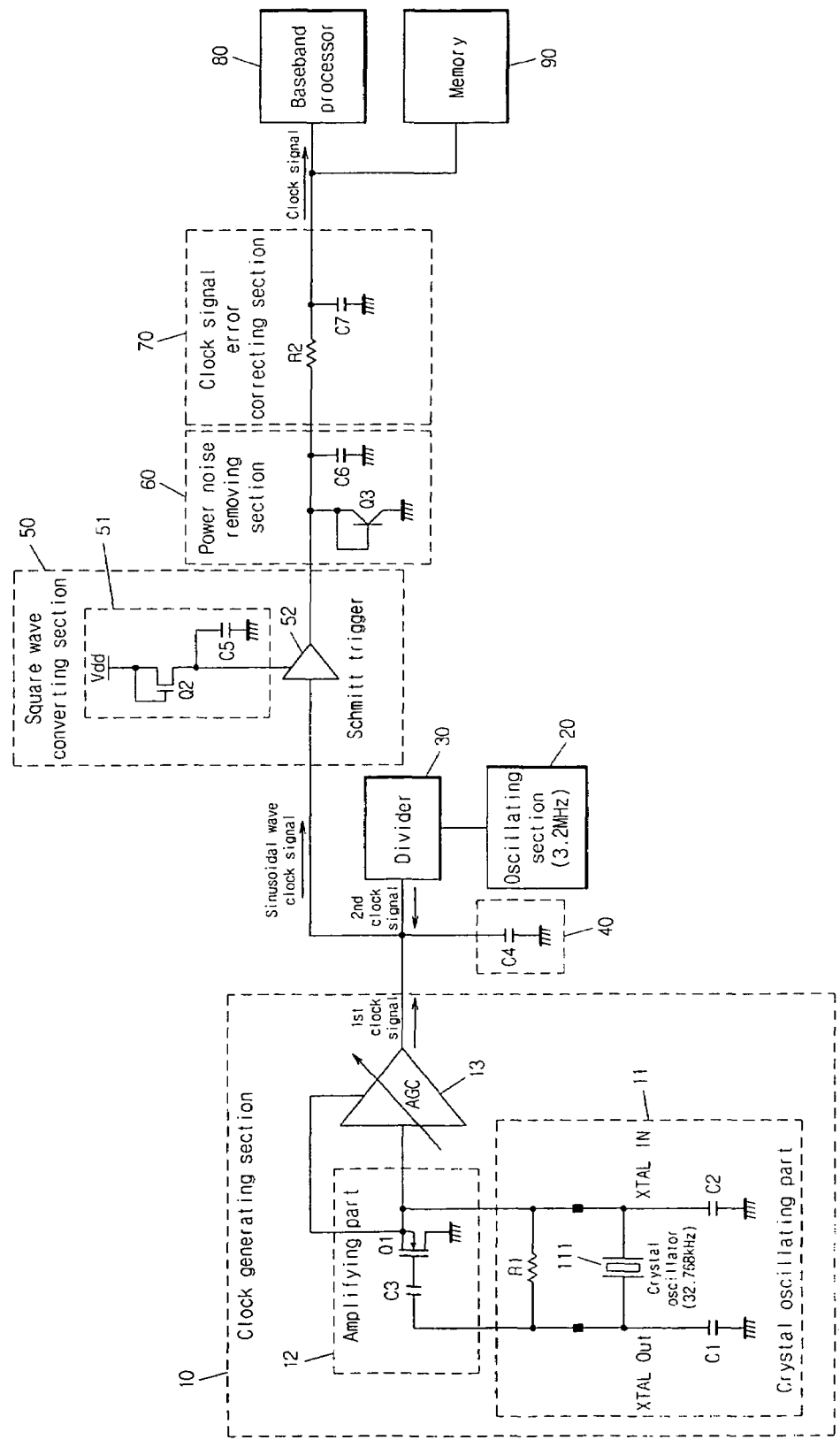
FIG. 2 is a block diagram showing a structure of an apparatus for generating a clock signal in a mobile communication terminal, according to an embodiment of the invention.

The apparatus for generating a clock signal shown in FIG. 2 can remove a Long term jitter noise which may be occurred when the first clock signal, which is an extremely low frequency outputted from the clock signal generating section 10, or the second clock signal, which is a medium frequency outputted via the oscillating section 20 and the divider 30, into a square wave clock signal. Alternatively, according to another embodiment of the invention, only one of the clock signal generating section 10 generating the first clock signal and the generating section generating the second clock signal (i.e., oscillating section 20 and divider 30) may be provided.

As in case of the embodiment shown in FIG. 2, when the first and second clock signals are simultaneously generated by the clock signal generating section 10, the oscillating section 20 and the divider 30, the first clock signal of extremely low frequency is combined to the second clock signal of medium frequency and outputted to the square wave converting section 50 as a sinusoidal wave clock signal.

The surge current preventing section 40 may comprise a capacitor C4 having an end connected to a ground. The surge current preventing section 40 removes a surge current and a ground bounce occurring in the sinusoidal wave clock signal (first clock signal and/or second clock signal), and then outputs the clock signal to the square wave converting section 50.

The square wave converting section 50 converts the sinusoidal wave clock signal having the surge current removed therefrom into a square wave clock signal using a driving power (Vdd). A power stabilizing part 51 of the square wave converting section 50 may comprise a transistor Q2 serving as a diode, whose gate and source commonly connected is applied with a driving power (Vdd), and a capacitor C5 connected to a drain of the transistor Q2. The power stabilizing part 51 removes an alternating current component of the driving power (Vdd) through the transistor Q2 and the capacitor C5 to stabilize the driving power (Vdd).

A Schmitt trigger 52 is driven by the stabilized driving power (Vdd) to convert the sinusoidal wave clock signal having the surge current removed therefrom into a square wave clock signal, and output the converted signal. Like this, the stabilized driving power (Vdd) is supplied to the Schmitt trigger 52, so that the jitter noise is removed.

The power noise removing section 60 removes a power noise such as overshoot, undershoot and the like contained in the square wave clock signal outputted from the square wave converting section 50. The power noise removing section 60 may comprise a BJT transistor Q3 serving as a diode, whose base and collector are commonly connected and emitter is connected to a ground, and a capacitor C6 for removing an alternating current component, and removes the power noise while the square wave clock signal is 'low' or 'high'.

The clock signal error correcting section 70 outputs the square wave clock signal received from the power noise removing section 60 after a predetermined delay time. Thus, it is possible to supply a clock signal having corrected an error due to a Long term jitter noise for a time axis to a baseband processor 60, a memory and other devices in a mobile communication terminal.

The clock signal error correcting section 70 can delay the square wave clock signal through a resistance R2 which has an end connected to an output terminal of the power noise removing section 60, and a capacitor C7 which has an end connected to the other end of the resistance R2 and the other end connected to a ground.

Figure 3:
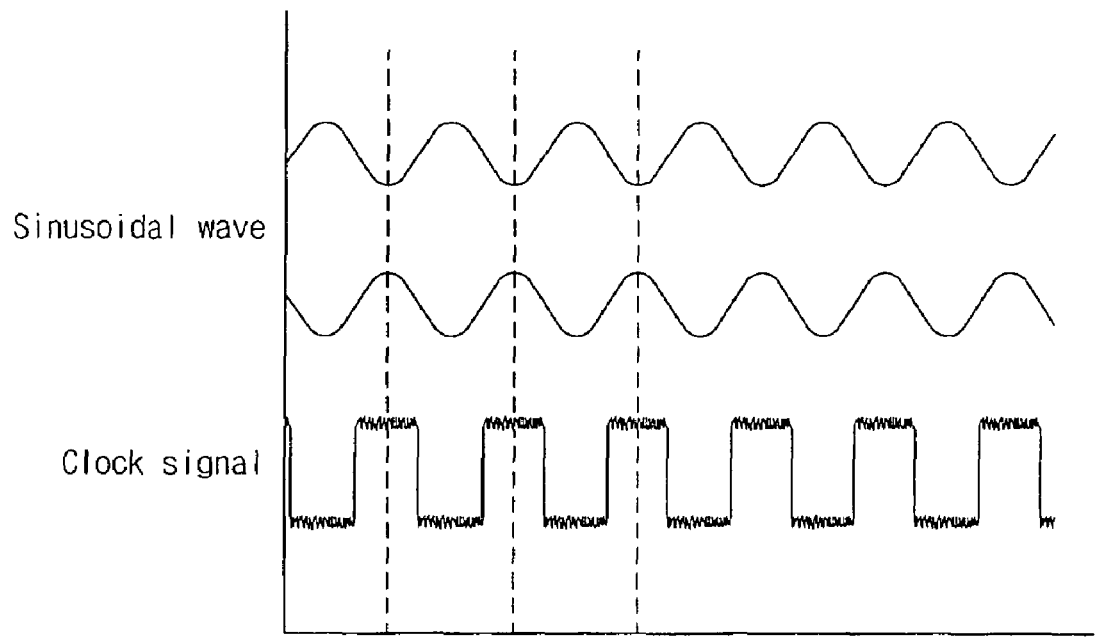
FIG. 3(*a*) is a waveform diagram of a clock signal inputted in a clock signal error correcting section in the apparatus for generating a clock signal shown in FIG. 2.
Figure 3:
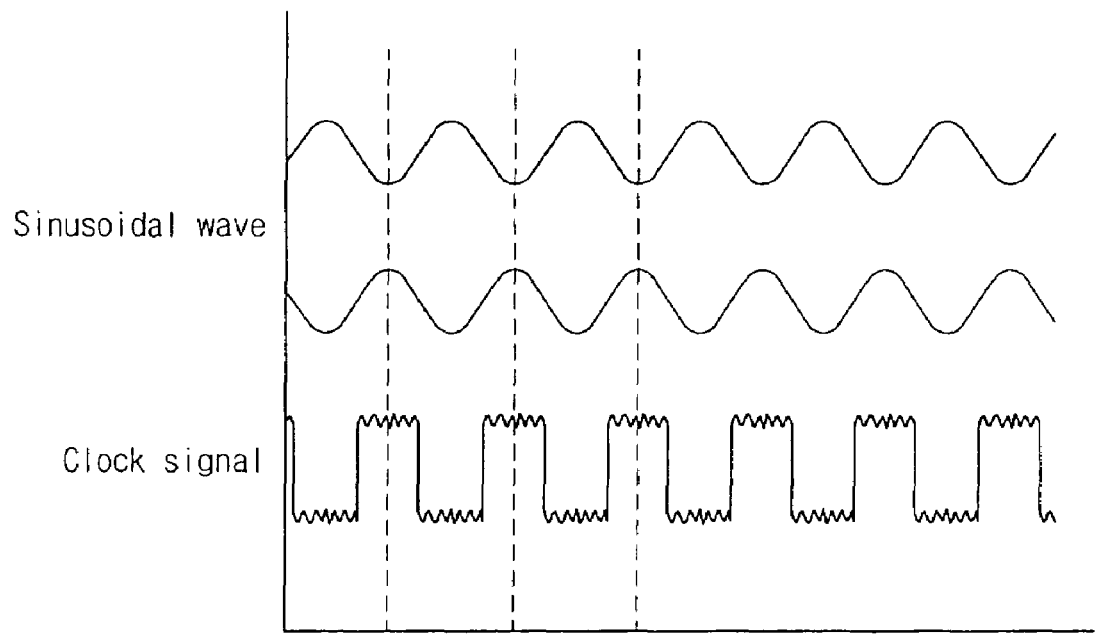

FIG. 3(*a*) shows sinusoidal waves outputted from input/output terminals (XTAL IN, XTAL OUT) of the crystal oscillating part 11 and a square wave clock signal which is a signal generated by converting the sinusoidal waves. The square wave clock signal shown in FIG. 3(*a*) is a signal before passing through the power noise removing section 60 and the clock signal error correcting section 70. It can be seen that the power noise is present when the square wave clock signal is under 'low' or 'high' state.

FIG. 3(*b*) shows sinusoidal waves and a square wave clock signal which is a signal generated by converting the sinusoidal waves and then passing the converted waves through the power noise removing section 60 and the clock signal error correcting section 70. In FIG. 3(b), it can be seen that the power noise is removed from the square wave clock signal.

As described above, according to the invention, the sinusoidal wave of low input signal oscillated from the crystal is converted into a square wave clock signal by the stabilized driving power having no alternating current components, the power noise of the converted signal is removed and then the converted signal is outputted after a predetermined delay time. Accordingly, it is possible to stably supply the clock signal having the Long term jitter noise removed therefrom to the various devices in the mobile communication terminal, such as baseband processor, memory and the like.

While the invention has been shown and described with reference to certain preferred embodiments thereof, it will be understood by those skilled in the art that various changes in form and details may be made thereto without departing from the spirit and scope of the invention as defined by the appended claims.

What is claimed is:

1. An apparatus for generating a clock signal in a mobile communication terminal, the apparatus comprising:
    a clock signal generating section for outputting a sinusoidal wave clock signal having an extremely low oscillating frequency;
    a surge current preventing section for removing a surge current of the sinusoidal wave clock signal;
    a square wave converting section for converting the sinusoidal wave clock signal having the surge current removed therefrom into a square wave clock signal using a driving power having no alternating current components;
    a power noise removing section for removing a power noise included in the square wave clock signal outputted from the square wave converting section; and
    a clock signal error correcting section for receiving the square wave clock signal outputted from the power noise removing section and outputting the received square wave clock signal after a predetermined delay time.

2. The apparatus according to claim 1, wherein the clock signal generating section comprises,
    a crystal oscillating part for outputting a sinusoidal wave using a crystal oscillator;
    an amplifying part for amplifying the sinusoidal wave outputted from the crystal oscillating part to a predetermined level; and
    an automatic gain control for controlling a gain of the sinusoidal wave outputted from the amplifying part.

3. The apparatus according to claim 1, wherein the square wave converting section comprises,
    a power stabilizing part for removing an alternating current component of voltage signal components received from a driving power and maintaining a rated voltage; and
    a Schmitt trigger for converting the sinusoidal wave having the surge current removed therefrom into a square wave clock signal, wherein the Schmitt trigger is driven by the driving power having the alternating current component removed therefrom.

4. The apparatus according to claim 3, wherein the power stabilizing part comprises,
    a MOS transistor serving as a diode, whose gate and source is commonly applied with the driving power; and
    a capacitor for removing the alternating current component of the driving power, wherein the capacitor has an end connected to a ground and the other end connected to a drain of the transistor.

5. The apparatus according to claim 1, wherein the surge current preventing section comprises a capacitor having an end connected to a ground and the other end connected to an input terminal of the square wave converting section.

6. The apparatus according to claim 1, wherein the power noise removing section comprises,
    a BJT transistor serving as a diode, whose base and collector are commonly connected and emitter is connected to a ground; and
    a capacitor having an end commonly connected to the collector of the BJT transistor and the other end connected to a ground and removing an alternating current component of the square wave clock signal outputted from the square wave converting section.

7. The apparatus according to claim 1, wherein the clock signal error correcting section comprises,
    a resistance having an end connected to an output terminal of the power noise removing section; and
    a capacitor having an end connected to the other end of the resistance and the other end connected to a ground.

8. An apparatus for generating a clock signal in a mobile communication terminal, the apparatus comprising:
    an oscillating section for outputting a sinusoidal wave having a medium oscillating frequency;
    a divider for dividing an output of the oscillating section in a predetermined dividing ratio to output a sinusoidal wave clock signal;
    a surge current preventing section for removing a surge current of the sinusoidal wave clock signal;
    a square wave converting section for converting the sinusoidal wave clock signal having the surge current removed therefrom into a square wave clock signal using a driving power having no alternating current components;
    a power noise removing section for removing a power noise included in the square wave clock signal outputted from the square wave converting section; and
    a clock signal error correcting section for receiving the square wave clock signal outputted from the power noise removing section and outputting the received square wave clock signal after a predetermined delay time.

9. The apparatus according to claim 8, wherein the square wave converting section comprises,
    a power stabilizing part for removing an alternating current component of voltage signal components received from a driving power and maintaining a rated voltage; and
    a Schmitt trigger for converting the sinusoidal wave having the surge current removed therefrom into a square wave clock signal, wherein the Schmitt trigger is driven by the driving power having the alternating current component removed therefrom.

10. The apparatus according to claim 9, wherein the power stabilizing part comprises,
    a MOS transistor serving as a diode, whose gate and source is commonly applied with the driving power; and
    a capacitor for removing the alternating current component of the driving power, wherein the capacitor has an end connected to a ground and the other end connected to a drain of the transistor.

11. The apparatus according to claim 8, wherein the surge current preventing section comprises a capacitor having an end connected to a ground and the other end connected to an input terminal of the square wave converting section.

12. The apparatus according to claim 8, wherein the power noise removing section comprises,
    a BJT transistor serving as a diode, whose base and collector are commonly connected and emitter is connected to a ground; and a capacitor having an end commonly connected to the collector of the BJT transistor and the other end connected to a ground and removing an alternating current component of the square wave clock signal outputted from the square wave converting section.

13. The apparatus according to claim 8, wherein the clock signal error correcting section comprises,
- a resistance having an end connected to an output terminal of the power noise removing section; and
- a capacitor having an end connected to the other end of the resistance and the other end connected to a ground.

14. An apparatus for generating a clock signal in a mobile communication terminal, the apparatus comprising:
- a clock signal generating section for outputting a sinusoidal wave clock signal having an extremely low oscillating frequency;
- an oscillating section for outputting a sinusoidal wave having a medium oscillating frequency;
- a divider for dividing an output of the oscillating section in a predetermined dividing ratio to output a second sinusoidal wave clock signal;
- a surge current preventing section for removing surge currents of the first and second clock signals;
- a square wave converting section for converting the first and second sinusoidal wave clock signals having the surge currents removed therefrom into a square wave clock signal using a driving power having no alternating current components;
- a power noise removing section for removing a power noise included in the square wave clock signal outputted from the square wave converting section; and
- a clock signal error correcting section for receiving the square wave clock signals outputted from the power noise removing section and outputting the received square wave clock signals after a predetermined delay time.

15. The apparatus according to claim 14, wherein the clock signal generating section comprises,
- a crystal oscillating part for outputting a sinusoidal wave using a crystal oscillator;
- an amplifying part for amplifying the sinusoidal wave outputted from the crystal oscillating part to a predetermined level; and
- an automatic gain control for controlling a gain of the sinusoidal wave outputted from the amplifying part.

16. The apparatus according to claim 14, wherein the square wave converting section comprises,
- a power stabilizing part for removing an alternating current component of voltage signal components received from a driving power and maintaining a rated voltage; and
- a Schmitt trigger for converting the sinusoidal wave having the surge current removed therefrom into a square wave clock signal, wherein the Schmitt trigger is driven by the driving power having the alternating current component removed therefrom.

17. The apparatus according to claim 16, wherein the power stabilizing part comprises,
- a MOS transistor serving as a diode, whose gate and source is commonly applied with the driving power; and
- a capacitor for removing the alternating current component of the driving power, wherein the capacitor has an end connected to a ground and the other end connected to a drain of the transistor.

18. The apparatus according to claim 14, wherein the surge current preventing section comprises a capacitor having an end connected to a ground and the other end connected to an input terminal of the square wave converting section.

19. The apparatus according to claim 14, wherein the power noise removing section comprises,
- a BJT transistor serving as a diode, whose base and collector are commonly connected and emitter is connected to a ground; and
- a capacitor having an end commonly connected to the collector of the BJT transistor and the other end connected to a ground and removing an alternating current component of the square wave clock signal outputted from the square wave converting section.

20. The apparatus according to claim 14, wherein the clock signal error correcting section comprises,
- a resistance having an end connected to an output terminal of the power noise removing section; and
- a capacitor having an end connected to the other end of the resistance and the other end connected to a ground.

* * * * *